(12) United States Patent
Lin

(10) Patent No.: US 11,683,906 B2
(45) Date of Patent: Jun. 20, 2023

(54) STORAGE DEVICE FRAME ASSEMBLY AND SERVER

(71) Applicant: Wiwynn Corporation, New Taipei (TW)

(72) Inventor: Wei Chen Lin, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 0 days.

(21) Appl. No.: 17/475,409

(22) Filed: Sep. 15, 2021

(65) Prior Publication Data

US 2022/0377928 A1 Nov. 24, 2022

(30) Foreign Application Priority Data

May 24, 2021 (TW) .................................. 110118662

(51) Int. Cl.
*H05K 7/18* (2006.01)
*H05K 5/02* (2006.01)

(52) U.S. Cl.
CPC .............. *H05K 7/18* (2013.01); *H05K 5/023* (2013.01); *H05K 5/0204* (2013.01); *H05K 5/0221* (2013.01); *H05K 5/0226* (2013.01); *H05K 5/0295* (2013.01)

(58) Field of Classification Search
CPC ....................................................... H05K 5/00
See application file for complete search history.

(56) References Cited

U.S. PATENT DOCUMENTS

2020/0281086 A1* 9/2020 Wang .................. G11B 33/124

FOREIGN PATENT DOCUMENTS

| TW | 201105218 A | 2/2011 |
| TW | 201603012 A | 1/2016 |
| TW | M527670 U | 8/2016 |

OTHER PUBLICATIONS

TW Office Action dated May 9, 2022 in Taiwan application No. 110118662.

* cited by examiner

*Primary Examiner* — Jerry Wu
(74) *Attorney, Agent, or Firm* — McClure, Qualey & Rodack, LLP

(57) ABSTRACT

A storage device frame assembly is configured to be mounted on a first side plate. The storage device frame assembly includes a support frame and a handle. The support frame is configured to be removably mounted on the first side plate. The handle includes a pivotable component and a slidable component. The pivotable component is pivotably disposed on the support frame. The slidable component is slidably disposed on the pivotable component.

6 Claims, 11 Drawing Sheets

STORAGE DEVICE FRAME ASSEMBLY AND SERVER

CROSS-REFERENCE TO RELATED APPLICATIONS

This non-provisional application claims priority under 35 U.S.C. § 119(a) on Patent Application No(s). 110118662 filed in Taiwan, R.O.C. on May 24, 2021, the entire contents of which are hereby incorporated by reference.

TECHNICAL FIELD

The disclosure provides a storage device frame assembly and a server, more particularly to a storage device frame assembly having a handle and the server including the same.

BACKGROUND

As internet progresses, people widely use the internet to deal with daily stuffs. In order to provide better internet service, a host server is required to equip with many storage devices (e.g., hard disk drives) to store data or information.

In general, the storage device is mounted in the server casing via a frame body, and the frame body helps the installation of the storage device into the server casing or the removal of the storage device from the server casing. During the removal of the storage device from the server casing, a handle of the frame body is required to be opened and pivoted to move the storage device upward. However, after the handle is pivoted, the handle may be located above two adjacent storage devices and thus interfere with the removal of such storage devices. Therefore, how to prevent the handle from interfering with the removal of the adjacent storage devices is one of the crucial topics in this field.

SUMMARY

The disclosure provides a storage device frame assembly and a server that enable an efficient removal and installation of objects being carried thereby.

One embodiment of the disclosure provides a storage device frame assembly configured to be mounted on a first side plate. The storage device frame assembly includes a support frame and a handle. The support frame is configured to be removably mounted on the first side plate. The handle includes a pivotable component and a slidable component. The pivotable component is pivotably disposed on the support frame. The slidable component is slidably disposed on the pivotable component.

Another embodiment of the disclosure provides a server. The server includes a casing, a storage device, and a storage device frame assembly. The casing includes a first side plate. The storage device frame assembly includes a support frame and a handle. The support frame accommodates the storage device and is removably mounted on the first side plate. The handle includes a pivotable component and a slidable component. The pivotable component is pivotably disposed on the support frame. The slidable component is slidably disposed on the pivotable component.

According to the storage device frame assembly and the server as discussed in the above embodiments, the slidable component is slidable relative to the pivotable component, such that the entire handle can be located between two extension surfaces of side surfaces of the adjacent storage devices facing each other, or located between an extension surface of the first surface and an extension surface of the second surface of the first side plate. Therefore, the handle is prevented from interfering with the removal of the adjacent storage devices.

In addition, compared to a case that the opened handle is inclined backward, the handle of the disclosure can be vertically erected, such that it can reduce the distance that the server is required to be drawn out of the server rack when the storage device located the most deeply in the server rack is maintained.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
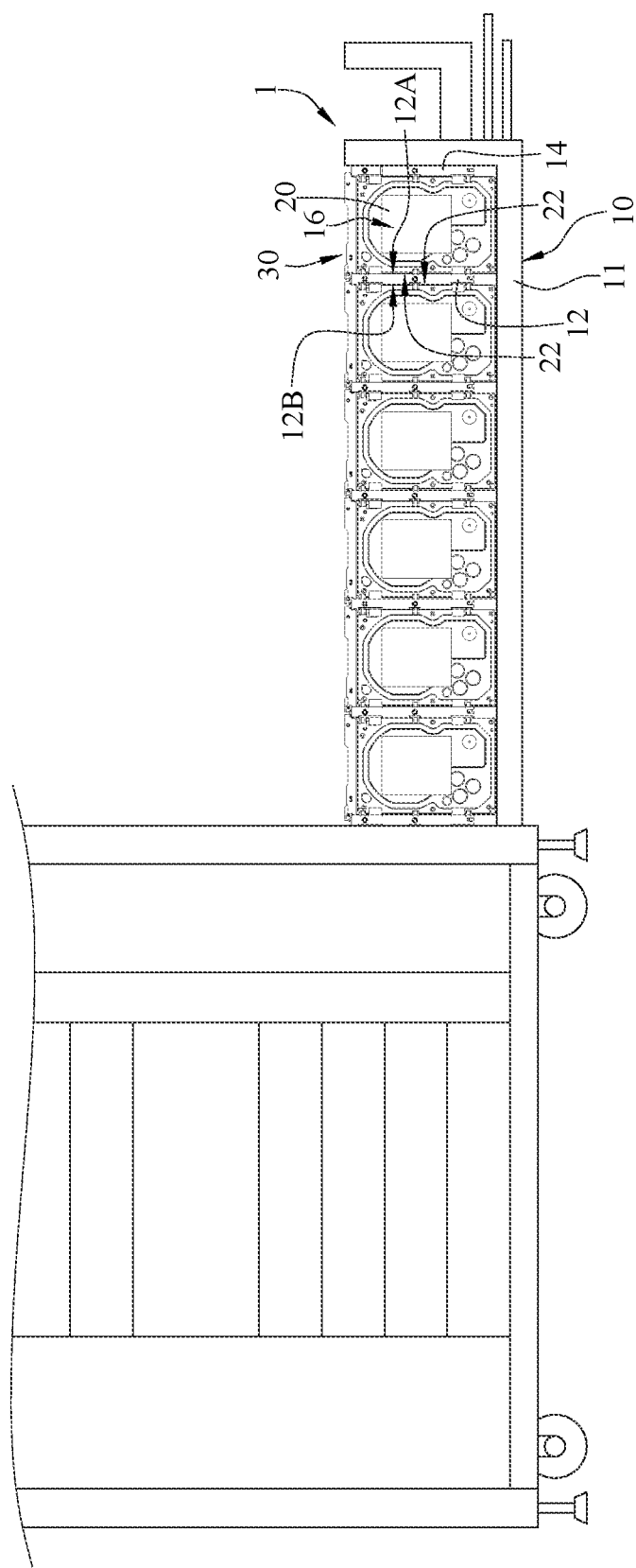
FIG. 1 is a side view of a server according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
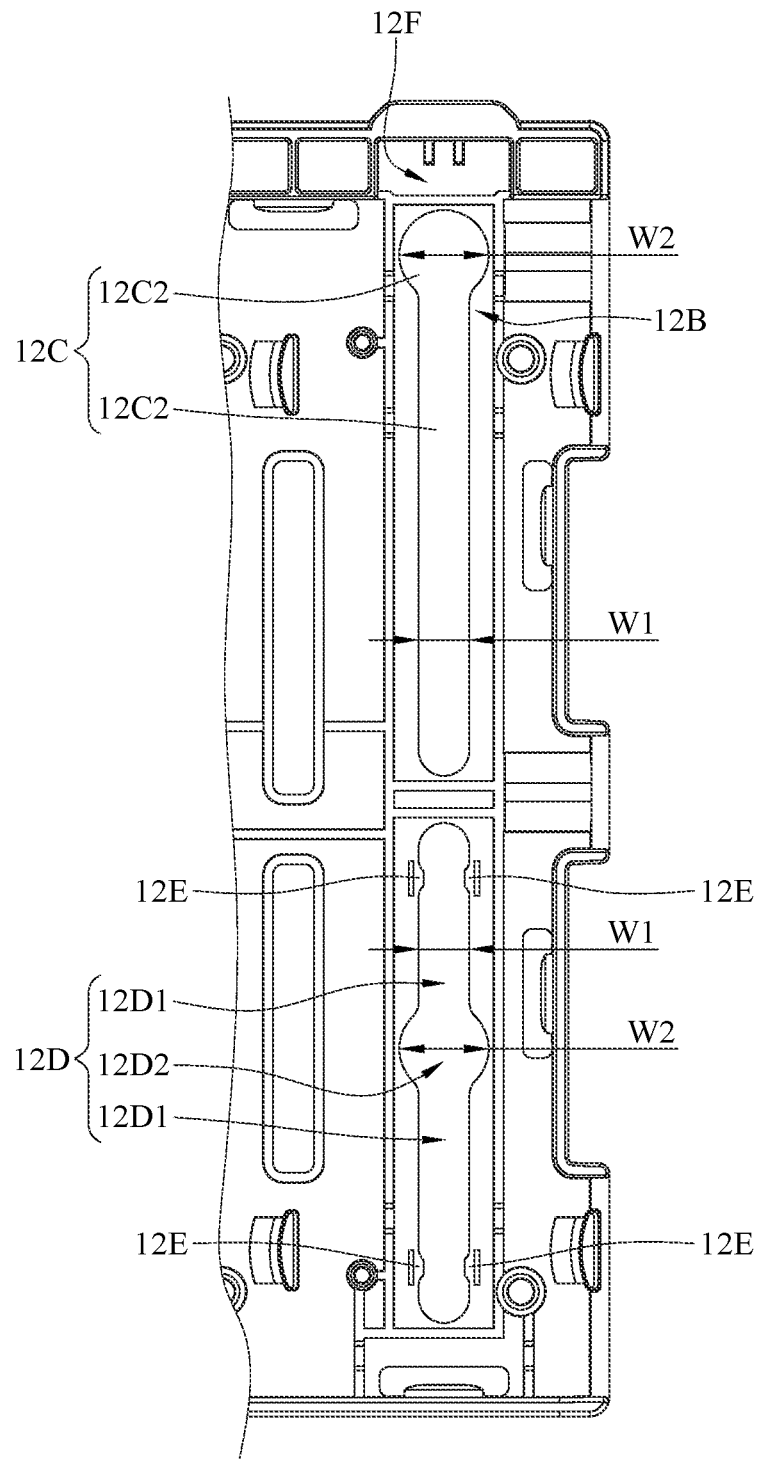
FIG. 2 is a partially enlarged planar view of the server in FIG. 1.

Referring to FIGS. 1 and 2, there are shown a side view of a server 1 according to one embodiment of the disclosure and a partially enlarged planar view of the server 1.

The server 1 may be slidably disposed in any suitable server rack or on any suitable platform or interface. The server 1 includes a casing 10, a storage device 20, and a storage device frame assembly 30. The casing 10 may include a bottom plate and a plurality of side plates. The side plates stand on the bottom plate and are spaced apart from one another, such that two adjacent side plates and the bottom plate together form an installation space therebetween. Specifically, in this embodiment, the casing 10 includes a bottom plate 11, a first side plate 12, and a second side plate 14, the first side plate 12 and the second side plate 14. The first side plate 12 and the second side plate 14 stand on the bottom plate 11 and are spaced apart from each other so as to define an installation space 16 therebetween. In more detail, the first side plate 12 has a first surface 12A and a second surface 12B located at opposite sides thereof and respectively face opposite directions.

As shown in FIG. 2, the first side plate 12 further has an engagement slot 12C, an engagement slot 12D, and a plurality of positioning structures 12E. The engagement slots 12C and 12D penetrate through the first surface 12A and the second surface 12B, and the engagement slot 12D is located closer to the bottom plate 11 than the engagement slot 12C; that is, the engagement slot 12C is located above the engagement slot 12D. In more detail, the engagement slot 12C has a narrow portion 12C1 and a wide portion 12C2, as shown, a width W2 of the wide portion 12C2 is greater than a width W1 of the narrow portion 12C1, and the wide portion 12C2 is located farther away from the engagement slot 12D than the narrow portion 12C1. In addition, the engagement slot 12D has two narrow portions 12D1 and a wide portion 12D2 located between the narrow portions 12D1, as shown, a width W2 of the wide portion 12D2 is greater than a width W1 of each narrow portions 12D1. The positioning structures 12E are located at two opposite edges of the narrow portions 12D1. Each of the positioning structures 12E may be an elastic protrusion configured for positioning the storage device frame assembly 30.

In addition, referring to FIG. 1, the storage device 20 may be, but not limited to, a 2.5 or 3.5-inch hard disk drive and is removably placed into the installation space 16.

Figure 3:
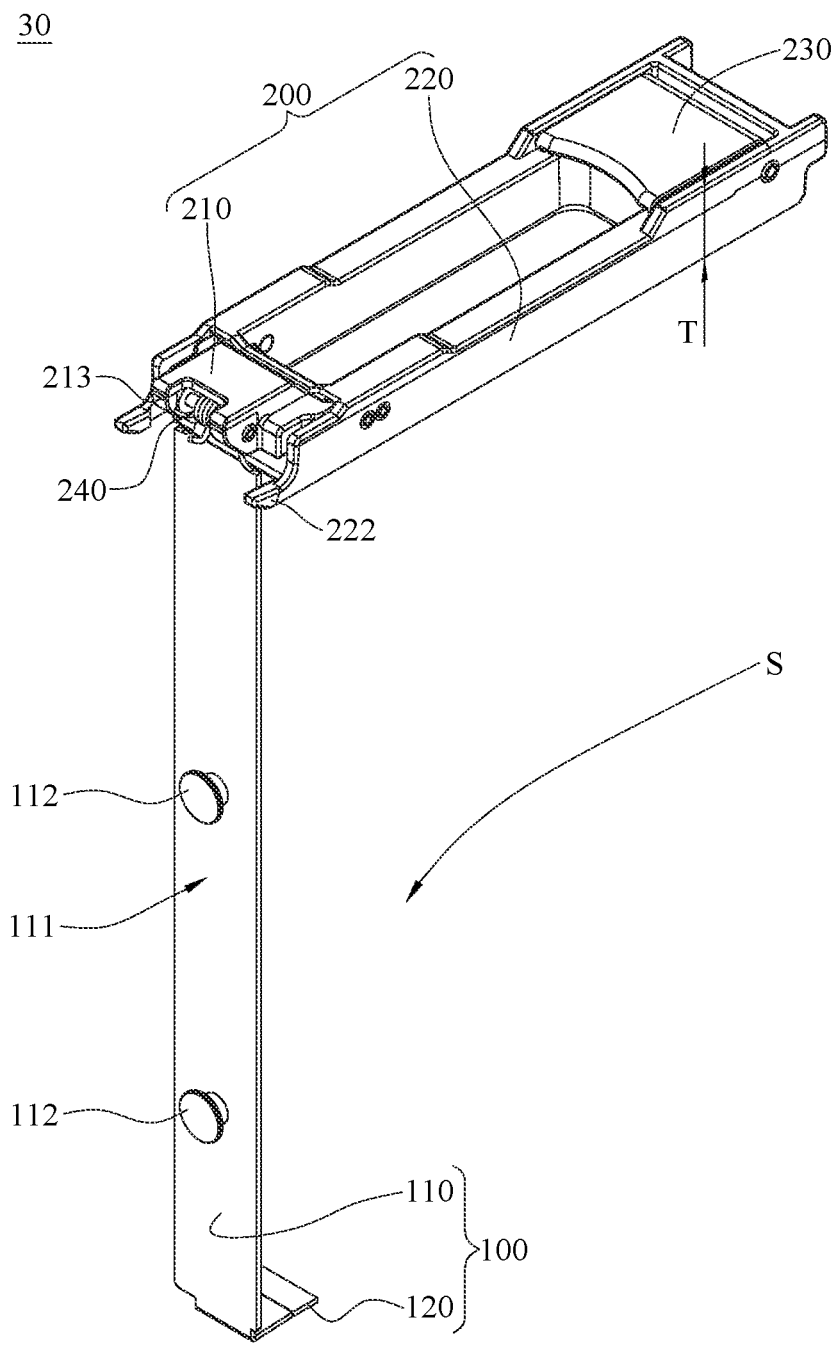
FIG. 3 is a perspective view of a storage device frame assembly of the server in FIG. 1.
Figure 4:
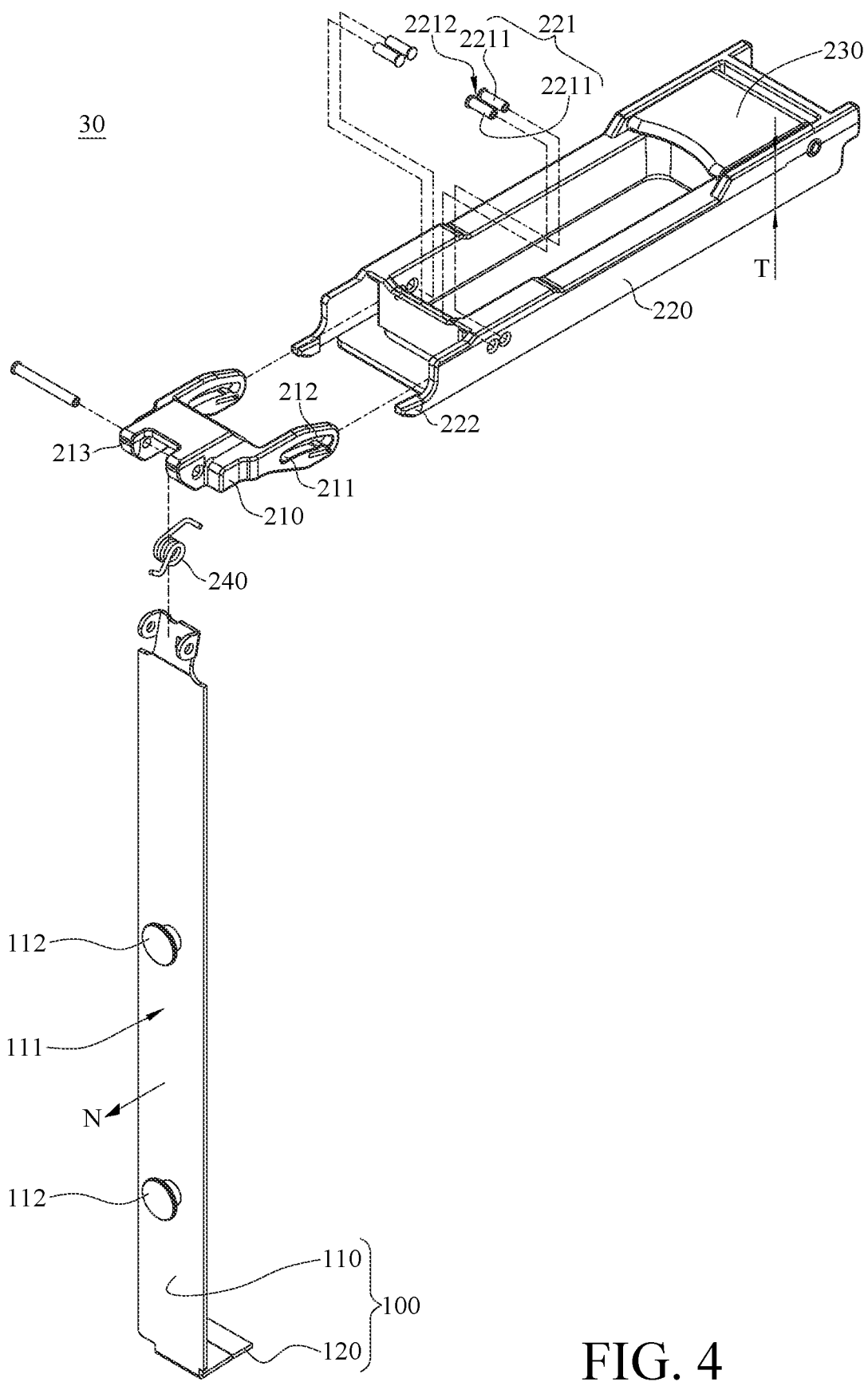
FIG. 4 is an exploded view of the storage device frame assembly in FIG. 3.

Then, referring to FIGS. 3 and 4, there are shown a perspective view of the storage device frame assembly 30 and an exploded view of the storage device frame assembly 30. The storage device frame assembly 30 is configured for the installation of the storage device 20 into the installation space 16 of the casing 10 and the removal of the storage device 20 from the installation space 16 of the casing 10.

In detail, in this embodiment, the storage device frame assembly 30 includes a support frame 100 and a handle 200. The support frame 100 includes a mount part 110 and a support part 120 connected to one end of the mount part 110 and non-parallel to the mount part 110. The support part 120 may be substantially perpendicular to the mount part 110; that is, the support part 120 may be substantially at a right angle to the mount part 110. The support part 120 and the mount part 110 define an accommodation space S therebetween. The accommodation space S is configured to accommodate the storage device 20. In addition, the mount part 110 may have an outer surface 111 and two engagement structures 112 on the outer surface 111. The outer surface 111 faces away from the accommodation space S and faces the first surface 12A of the first side plate 12. The engagement structures 112 are configured to be engaged with the engagement slots 12C and 12D. Each of the engagement structures 112 may be a T-pin having a head portion smaller than the wide portions 12C2 and 12D2 but wider than the narrow portions 12C1 and 12D1 and a neck portion slightly narrower than the narrow portions 12C1 and 12D1. Thus, the engagement structures 112 are able to be engaged with the narrow portions 12C1 and 12D1 and released from the wide portions 12C2 and 12D2.

Figure 5:
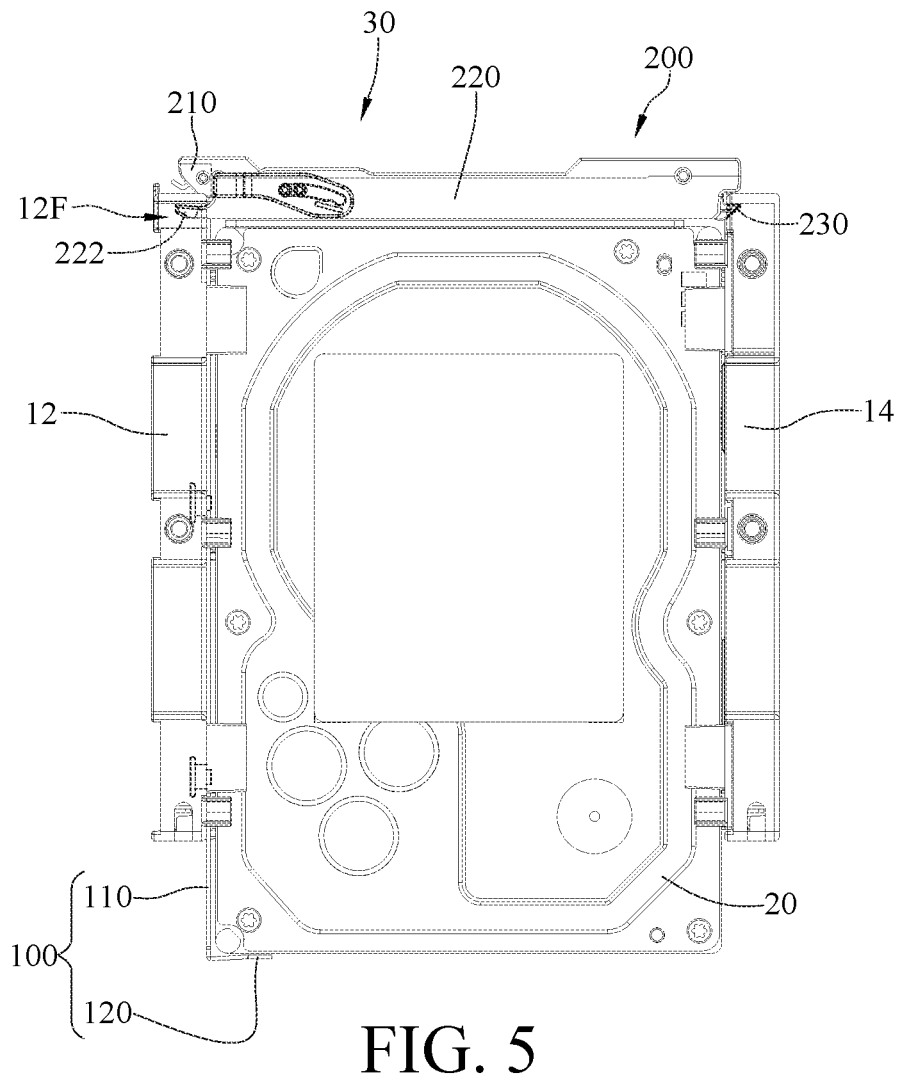
FIGS. 5 to 11 show an operation of the storage device frame assembly in FIG. 3.
Figure 6:
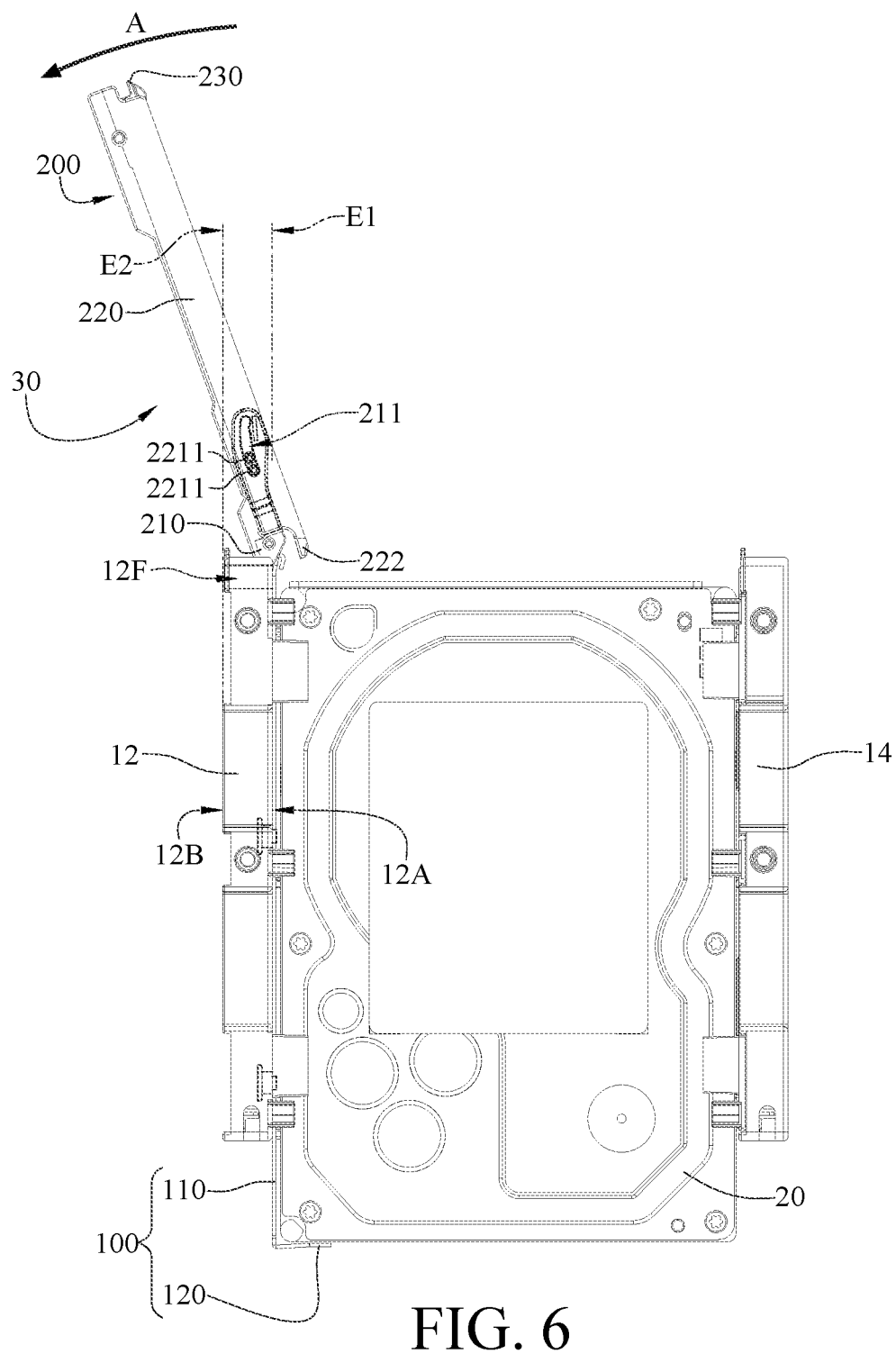

The handle 200 includes a pivotable component 210 and a slidable component 220. In addition, the handle 200 may further include an engagement component 230. The pivotable component 210 is pivotably disposed on another end of the mount part 110 opposite to the support part 120 and therefore has a closed position (as shown in FIG. 5) and an opened position (as shown in FIG. 6). When the pivotable component 210 is in the closed position, the pivotable component 210 is located at a side of the accommodation space S. When the pivotable component 210 is in the opened position, the pivotable component 210 is located away from the accommodation space S and is prevented from interfering the placement and removal of the storage device 20.

The handle 200 may further include an elastic component 240. The elastic component 240 may be a torsion spring in contact with the support frame 100 and the pivotable component 210 and is configured to constantly force the pivotable component 210 to pivot towards the opened position.

Figure 7:
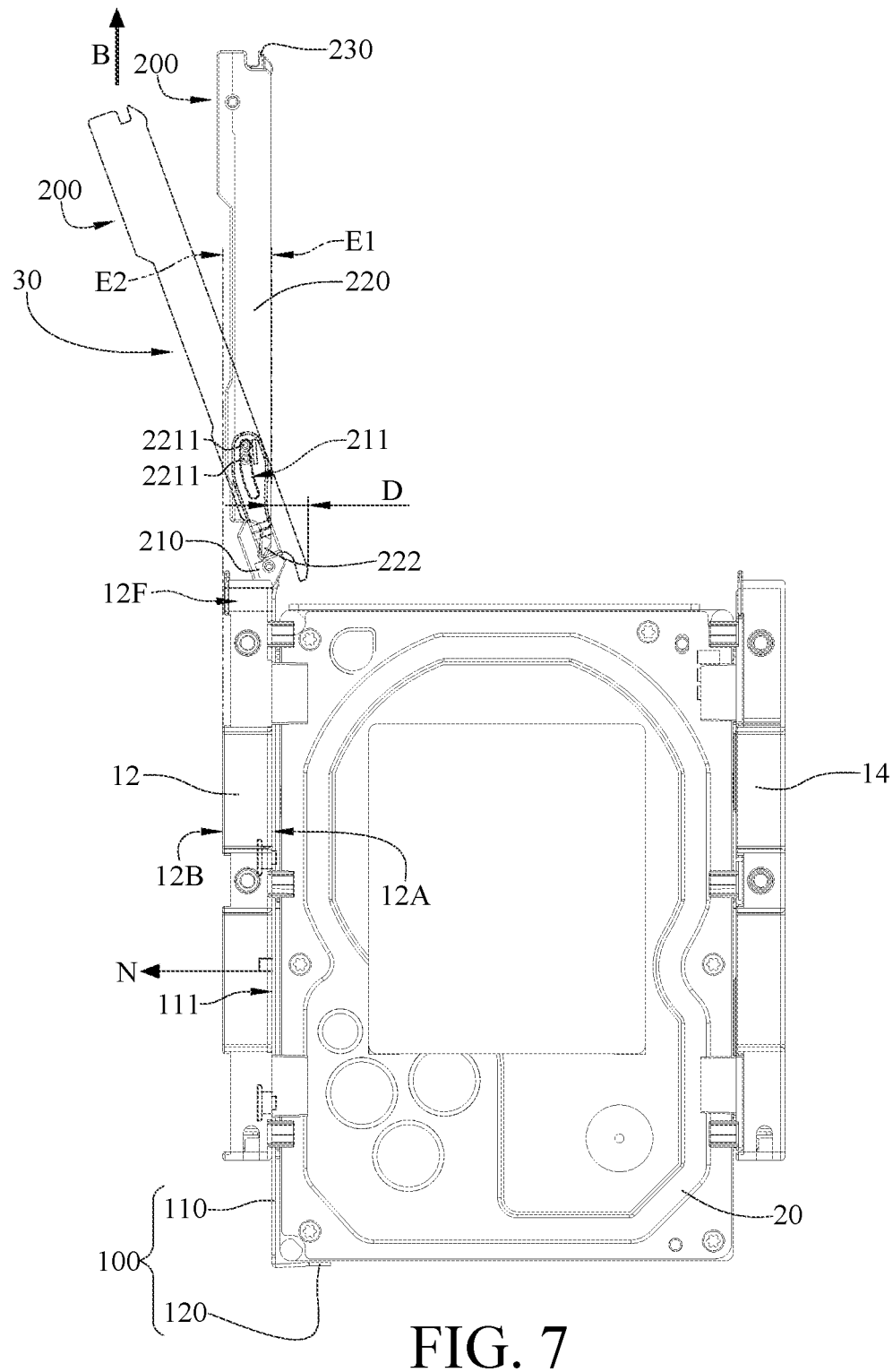

The slidable component 220 is slidably disposed on the pivotable component 210. When the pivotable component 210 is in the opened position, the slidable component 220 is slidable from a first position (as shown in FIG. 6) to a predetermined position (e.g., a second position as shown in FIG. 7) along a direction that is at an acute angle to the normal line N of the outer surface 111, such that the slidable component 220 can be moved a distance D (as shown in FIG. 7) along the normal line N, but the disclosure is not limited thereto; in another embodiment, the slidable component 220 may be slidable along a direction parallel to the normal line N of the outer surface 111 to be moved the distance D along the normal line N. When the slidable component 220 is in the first position, the slidable component 220 is non-parallel to the first side plate 12 and may interfere with the removal of adjacent storage devices 20. When the slidable component 220 is in the second position, the slidable component 220 is located above and substantially parallel to the first side plate 12 and located between an extension surface E1 (as shown in FIG. 7) of the first surface 12A and an extension surface E2 (as shown in FIG. 7) of the second surface 12B of the first side plate 12; that is, the first side plate 12 and the slidable component 220 are aligned with each other and arranged in a straight line so that the slidable component 220 does not interfere with the removal of adjacent storage devices 20.

Note that the slidable component 220 is not restricted to be located between the extension surface E1 of the first surface 12A and the extension surface E2 of the second surface 12B of the first side plate 12; in some other embodiments, when the slidable component has a thickness smaller than the distance between the adjacent storage devices, the slidable may be located between two extension surfaces of the side surfaces 22 of the adjacent storage devices 20 facing each other. In this way, the slidable component still ensures the removal of the adjacent storage devices.

Note that the slidable component 220 and the first side plate 12 are not restricted to be arranged in a straight line when the slidable component 220 is in the second position; in some other embodiments, when the slidable component has a thickness smaller than the distance between the adjacent storage devices, the slidable component 220 may be at an angle to the first side plate 12 as long as the slidable component still ensures the removal of the adjacent storage devices.

In this embodiment, the pivotable component 210 has a first guiding structure 211, and the slidable component 220 has a second guiding structure 221. The slidable component 220 is slidable relative to the pivotable component 210 via the second guiding structure 221 and the first guiding structure 211. Specifically, the first guiding structure 211 is, for example, a curved slot. As shown in FIG. 7, when the slidable component 220 is in the second position, a portion of the first guiding structure 211 located relatively away from the bottom plate 11 is extending in a direction substantially perpendicular to normal line N, while another portion of the first guiding structure 211 located relatively closer to the bottom plate 11 is extending in a direction at an angle to the former portion. The second guiding structure 221 may include two pillars 2211. The pillars 2211 are arranged side by side, parallel to each other, and movably located in the first guiding structure 211 (i.e., the curved slot). When the pivotable component 210 is in the opened position, and the pillars 2211 of the slidable component 220 are located at a side of the first guiding structure 211 located close to the bottom plate 11, the slidable component 220 is in the first position and may interfere with the removal of adjacent storage devices 20. When the pivotable component 210 is in the opened position, and the pillars 2211 of the slidable component 220 are located at a side of the first guiding structure 211 located away from the bottom plate 11, the slidable component 220 is in the second position and does not interfere with the removal of adjacent storage devices 20.

In this embodiment, each pair of the pillars 2211 define a positioning recess 2212 therebetween. The pivotable component 210 has a positioning protrusion 212 located in the first guiding structure 211. When the pivotable component 210 is in the opened position, and the slidable component 220 is moved from the first position to the second position, the positioning protrusion 212 is located at a side of the first guiding structure 211 located away from the bottom plate 11 and located at the positioning recess 2212 so as to position the slidable component 220 to the second position. Note that the positioning recess may be formed on other portion of the slidable component 220.

Note that the shape of the first guiding structure may be modified as required. In some other embodiments, the first guiding structure may be a slot consisting of a plurality of straight slots.

Note that the arrangement of the second guiding structure may be modified as required; in some other embodiments, the second guiding structure may be in a form of three pillars in any suitable shape, or may be in form of one or more protrusions in any suitable shape.

Note that the configurations of the first guiding structure and the second guiding structure may be modified as required; in some other embodiments, the first guiding structure may have two pillars or a protrusion while the second guiding structure may be a mating slot.

In this embodiment, the slidable component 220 may further have a latching structure 222 configured to be engaged with a hole 12F (as shown in FIG. 2) of the first side plate 12. The pivotable component 210 has a pressing portion 213 configured to press against a side of the first side plate 12 located away from the bottom plate 11 so as to move the support frame 100 away from the bottom plate 11.

The engagement component 230 is disposed on a side of the slidable component 220 located away from the pivotable component 210. When the pivotable component 210 is in the closed position, and the slidable component 220 is in the first position, the engagement component 230 is engaged with the second side plate 14 so as to fix the pivotable component 210 of the handle 200 in the closed position.

Referring to FIGS. 5 to 11, the operation of the storage device frame assembly 30 are described hereinafter. As shown in FIG. 5, the storage device 20 is accommodated in the installation space 16 of the casing 10 by using the storage device frame assembly 30, the pivotable component 210 is in the closed position, the slidable component 220 is in the first position, the latching structure 222 is engaged with the hole 12F of the first side plate 12, and the engagement component 230 is engaged with the second side plate 14. With the above arrangement, a connector (not shown) of the storage device 20 is ensured to be electrically connected to a mating connector of the motherboard (as shown) of the server 1.

Then, when it is attempted to remove the storage device 20, as shown in FIG. 6, the first step is to disengage the engagement component 230 of the handle 200 from the second side plate 14 and then to pivot the handle 200 to the opened position from the closed position (e.g., along a direction A). At this moment, the slidable component 220 is in the first position and interferes with the removal of the adjacent storage devices 20.

Then, as shown in FIG. 7, the second step is to pull the handle 200 (along a direction B) so as to move the slidable component 220 to the second position from the first position via the guidance of the first guiding structure 211 and the second guiding structure 221 while the pivotable component 210 is in the opened position. During the movement of the slidable component 220 to the second position from the first position, the latching structure 222 of the slidable component 220 has been moved the distance D along the normal line N of the outer surface 111. In the second position of the slidable component 220, the slidable component 220 is firmly fixed in position via the positioning protrusion 212 and the positioning recess 2212. At this moment, the slidable component 220 does not interfere with the removal of the adjacent storage devices 20.

Figure 8:
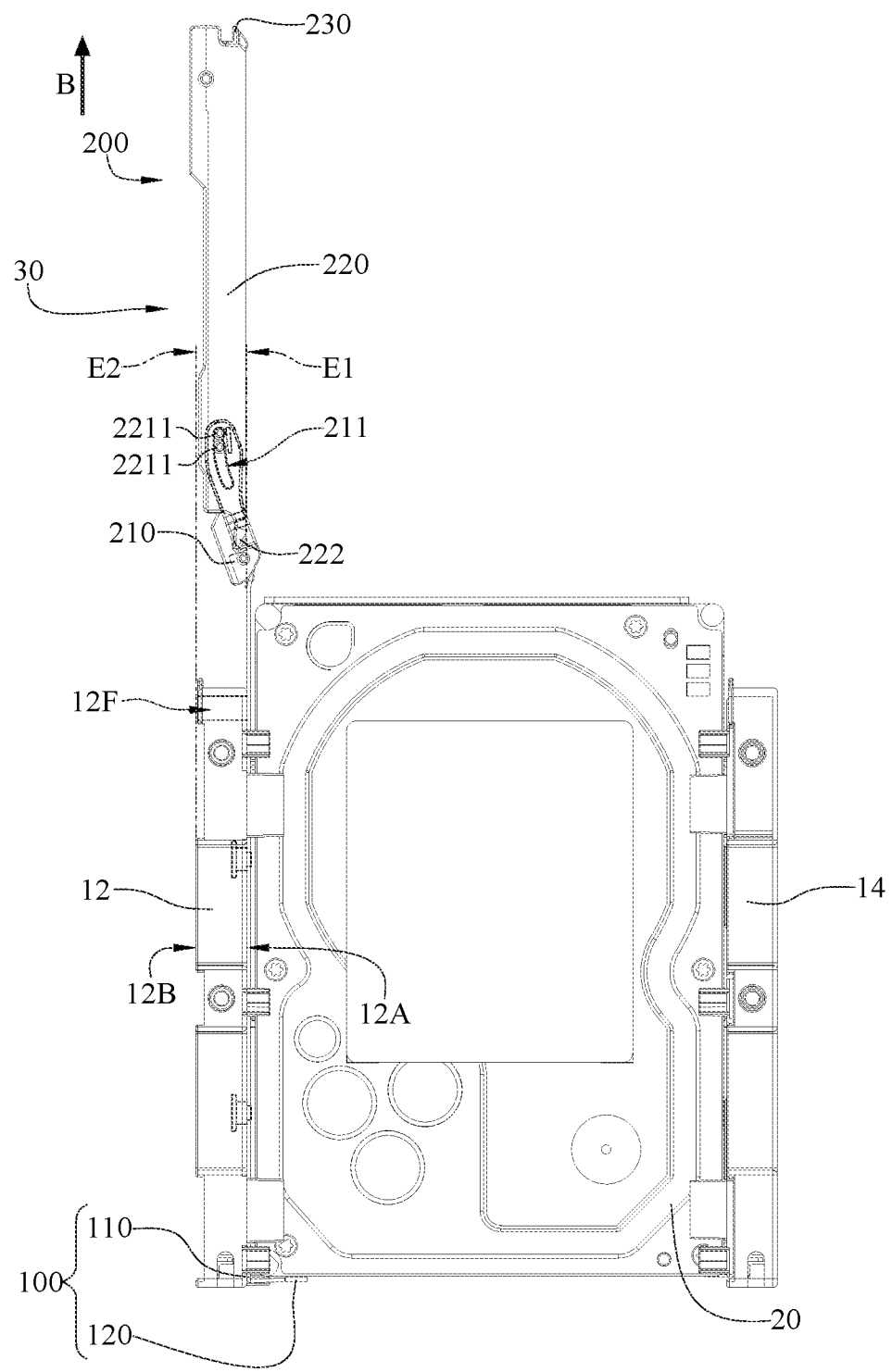
Figure 9:
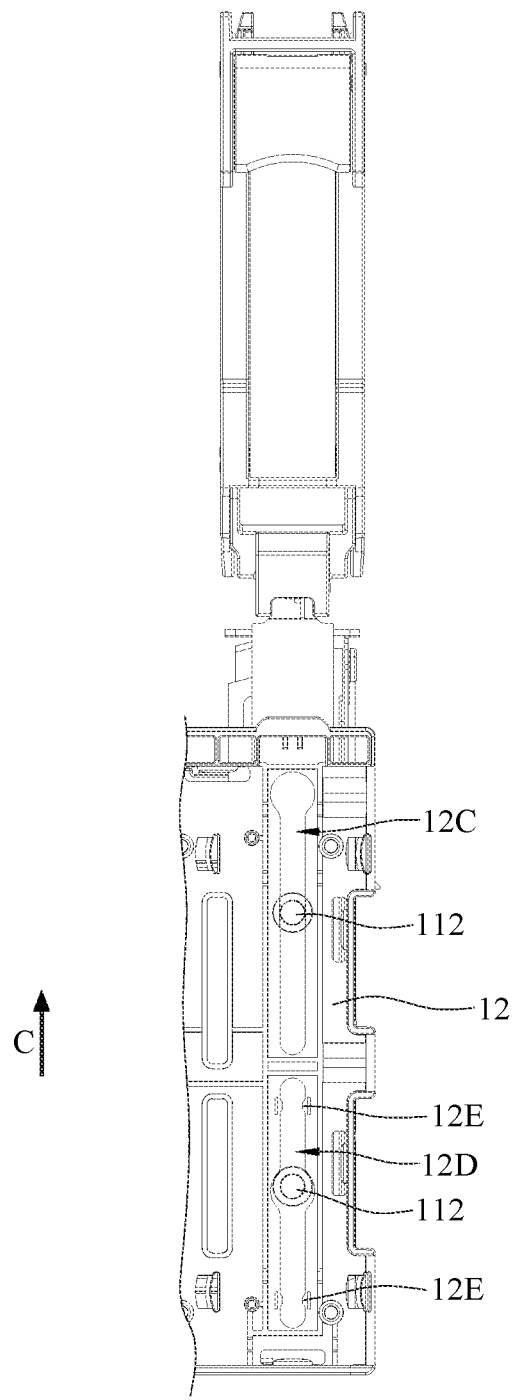

Then, as shown in FIGS. 8 and 9, the third step is to further pull the handle 200 so as to move the support frame 100 away from the bottom plate 11, such that the storage device 20 is moved along with the support frame 100 and is disconnected from the mating connector of the motherboard the server 1.

Figure 10:
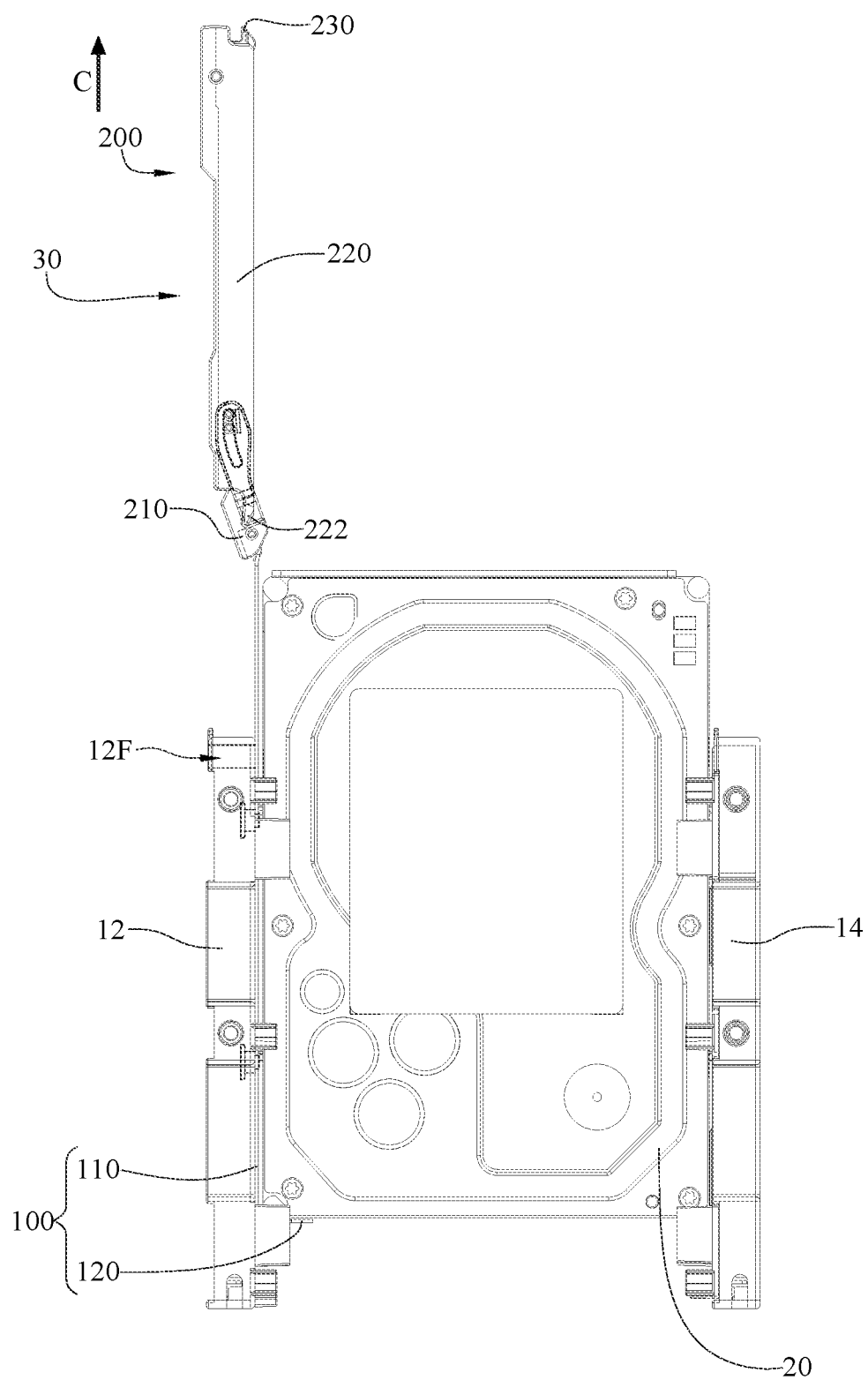
Figure 11:
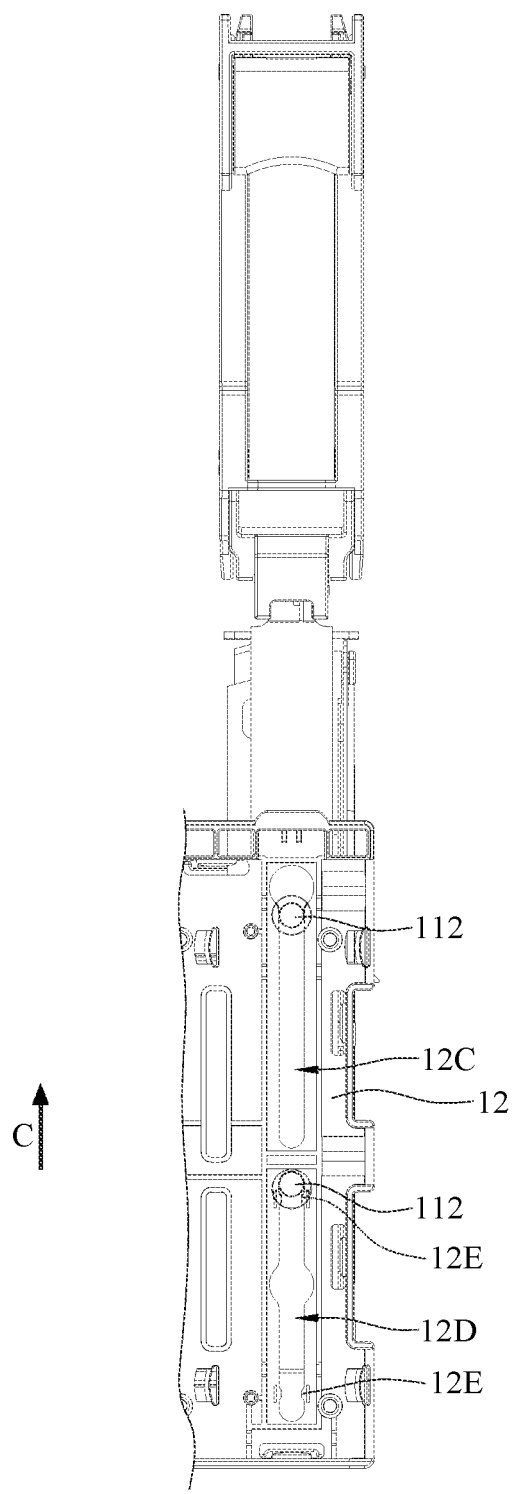

Then, as shown in FIGS. 10 and 11, the fourth step is to further pull the handle (e.g., along a direction C) to move the storage device 20 further away from the bottom plate 11 until the positioning structures 12E located at the side of the engagement slot 12D located away from the bottom plate 11 are engaged with the engagement structure 112. By doing so, the storage device frame assembly 30 is held in a predetermined position that facilitates the removal of the storage device 20.

On the other hand, during the installation of the storage device 20 into the installation space 16 of the casing 10, the positioning structures 12E located at the side of the engagement slot 12D close to the bottom plate 11 can prevent the storage device frame assembly 30 and the storage device 20 thereon from impacting the connector on the motherboard, thereby preventing damaging the connectors of both the storage device 20 and the motherboard.

Note that the first side plate 12 may also have positioning structures (similar to the positioning structures 12E) located at two opposite edges of the engagement slot 12C in some other embodiments. In another embodiment, the positioning structures of the first side plate may be omitted.

According to the storage device frame assembly and the server as discussed in the above embodiment, the slidable component is slidable relative to the pivotable component to offset along the normal line the outer surface of the support frame, such that the entire handle can be located between the two extension surfaces of the side surfaces of the adjacent storage devices, or located between the extension surface of the first surface and the extension surface of the second surface of the first side plate. Therefore, the handle is prevented from interfering with the removal of the adjacent storage devices.

In addition, compared to a case that the opened handle is inclined backward, the handle of the disclosure can be vertically erected, such that it can reduce the distance that the server is required to be drawn out of the server rack when the storage device located the most deeply in the server rack is maintained.

Moreover, the positioning structures of the first side plate can hold the storage device frame assembly in a predetermined positon for facilitating the installation or removal of the storage device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A storage device frame assembly, configured to be mounted on a first side plate, the storage device frame assembly comprising:
   a support frame, configured to be removably mounted on the first side plate; and
   a handle, comprising:
      a pivotable component, pivotably disposed on the support frame; and
      a slidable component, slidably disposed on the pivotable component wherein the pivotable component has a first guiding structure, the slidable component has a second guiding structure, the slidable component is slidable to be in a predetermined position relative to the pivotable component via the second guiding structure and the first guiding structure, the first side plate has a first surface and a second surface opposite to each other; when the slidable component is in the predetermined position, the slidable component is located between an extension surface of the first surface and an extension surface of the second surface;
   wherein the handle further comprises an engagement component, the engagement component is disposed on a side of the slidable component located away from the pivotable component, the engagement component is configured to be engaged with a second side plate located opposite to the first side plate, the slidable component has a latching structure configured to be engaged with a hole of the first side plate, the first guiding structure is a curved slot, and the second guiding structure comprises at least one pillar; when the slidable component is in the predetermined position, the first side plate and the slidable component are aligned with each other.

2. The storage device frame assembly according to claim 1, wherein when the slidable component is in the predetermined position, the slidable component is substantially parallel to the first side plate.

3. The storage device frame assembly according to claim 1, wherein the at least one pillar comprises a plurality of pillars parallel to each other, a positioning recess is formed between the plurality of pillars, the pivotable component has a positioning protrusion; when the slidable component is in the predetermined position, the positioning protrusion of the pivotable component is located at the positioning recess of the slidable component.

4. The storage device frame assembly according to claim 1, wherein the pivotable component has a pressing portion configured to press against the first side plate to move the support frame relative to the first side plate.

5. The storage device frame assembly according to claim 1, wherein the support frame comprises a mount part and a support part, the pivotable component is pivotably disposed on one end of the mount part, another end of the mount part is connected to the support part, the support part is non-parallel to the mount part, the mount part has a plurality of engagement structures configured to be engaged with the first side plate.

6. The storage device frame assembly according to claim 2, wherein the support frame comprises a mount part and a support part, the pivotable component is pivotably disposed on one end of the mount part, another end of the mount part is connected to the support part, the support part is non-parallel to the mount part, the mount part has a plurality of engagement structures configured to be engaged with the first side plate.

* * * * *